(12) United States Patent
Ying et al.

(10) Patent No.: US 7,405,002 B2
(45) Date of Patent: Jul. 29, 2008

(54) COATED WATER-SOLUBLE NANOPARTICLES COMPRISING SEMICONDUCTOR CORE AND SILICA COATING

(75) Inventors: Jackie Y. Ying, Singapore (SG); Subramanian T. Selvan, Singapore (SG); Timothy T. Tan, Singapore (SG)

(73) Assignee: Agency for Science, Technology and Research, Matrix (SG)

( * ) Notice: Subject to any disclaimer, the term of this patent is extended or adjusted under 35 U.S.C. 154(b) by 143 days.

(21) Appl. No.: 10/911,402

(22) Filed: Aug. 4, 2004

(65) Prior Publication Data

US 2006/0029802 A1 Feb. 9, 2006

(51) Int. Cl.
*B32B 5/16* (2006.01)
(52) U.S. Cl. .................. 428/404; 428/407; 977/773; 977/777
(58) Field of Classification Search ............... 428/403, 428/404, 407; 977/773, 777
See application file for complete search history.

(56) References Cited

U.S. PATENT DOCUMENTS

| | | | |
|---|---|---|---|
| 3,656,981 A * | 4/1972 | Beschke et al. ............... 8/523 |
| 4,751,194 A | 6/1988 | Cibert et al. |
| 5,549,973 A | 8/1996 | Majetich et al. |
| 5,751,018 A | 5/1998 | Alivisatos et al. |
| 5,783,263 A | 7/1998 | Majetich et al. |
| 5,788,738 A | 8/1998 | Pirzada et al. |
| 5,879,715 A | 3/1999 | Higgins et al. |
| 5,906,670 A | 5/1999 | Dobson et al. |
| 5,965,212 A | 10/1999 | Dobson et al. |
| 5,990,479 A | 11/1999 | Weiss et al. |
| 6,048,616 A | 4/2000 | Gallagher et al. |
| 6,090,666 A | 7/2000 | Ueda et al. |
| 6,103,868 A | 8/2000 | Heath et al. |
| 6,114,038 A | 9/2000 | Castro et al. |
| 6,179,912 B1 | 1/2001 | Barbera-Guillem et al. |
| 6,194,213 B1 | 2/2001 | Barbera-Guillem |
| 6,194,237 B1 | 2/2001 | Kim et al. |
| 6,203,768 B1 | 3/2001 | McCormick et al. |
| 6,207,229 B1 | 3/2001 | Bawendi et al. |
| 6,207,392 B1 | 3/2001 | Weiss et al. |
| 6,221,602 B1 | 4/2001 | Barbera-Guillem et al. |
| 6,225,198 B1 | 5/2001 | Alivisatos et al. |

(Continued)

FOREIGN PATENT DOCUMENTS

WO   WO 00/55631 A   9/2000

(Continued)

OTHER PUBLICATIONS

Gerion et al, "Synthesis and Properties of Biocompatible Water-Soluble Silica-Coated CdSe/ZnS Semiconductor Quantum Dots", J. Phys. Chem. B, 2001, 105, 8861-8871.*

(Continued)

*Primary Examiner*—H. T Le
(74) *Attorney, Agent, or Firm*—Wolf, Greenfield & Sacks, P.C.

(57) ABSTRACT

Nanoparticles and methods of making nanoparticles are provided. The nanoparticles may include semiconductor nanocrystals. A shell may encapsulate a nanoparticle core, and the shell may include non-organic material and may be silica. The shell may also include additional species such as PEG. In some embodiments, a passivation layer is in contact with the core.

13 Claims, 15 Drawing Sheets

U.S. PATENT DOCUMENTS

| | | | |
|---|---|---|---|
| 6,251,303 | B1 | 6/2001 | Bawendi et al. |
| 6,255,198 | B1 | 7/2001 | Linthicum et al. |
| 6,262,129 | B1 | 7/2001 | Murray et al. |
| 6,274,323 | B1 | 8/2001 | Bruchez et al. |
| 6,306,610 | B1 | 10/2001 | Bawendi et al. |
| 6,306,736 | B1 | 10/2001 | Alivisatos et al. |
| 6,309,701 | B1 | 10/2001 | Barbera-Guillem |
| 6,319,426 | B1 | 11/2001 | Bawendi et al. |
| 6,319,607 | B1 | 11/2001 | Barbera-Guillem et al. |
| 6,322,901 | B1 | 11/2001 | Bawendi et al. |
| 6,361,660 | B1 * | 3/2002 | Goldstein ............... 204/157.15 |
| 6,379,635 | B2 | 4/2002 | O'Brien et al. |
| 6,423,551 | B1 | 7/2002 | Weiss et al. |
| 6,426,513 | B1 | 7/2002 | Bawendi et al. |
| 6,440,213 | B1 | 8/2002 | Alivisatos et al. |
| 6,444,143 | B2 | 9/2002 | Bawendi et al. |
| 6,444,223 | B1 | 9/2002 | Tracy et al. |
| 6,468,808 | B1 | 10/2002 | Nie et al. |
| 6,548,168 | B1 * | 4/2003 | Mulvaney et al. ............ 428/402 |
| 6,548,264 | B1 | 4/2003 | Tan et al. |
| 6,572,673 | B2 | 6/2003 | Lee et al. |
| 6,576,155 | B1 | 6/2003 | Barbera-Guillem |
| 6,576,291 | B2 | 6/2003 | Bawendi et al. |
| 6,596,194 | B1 | 7/2003 | Dobson et al. |
| 6,602,671 | B1 | 8/2003 | Bawendi et al. |
| 6,607,829 | B1 | 8/2003 | Bawendi et al. |
| 6,617,583 | B1 | 9/2003 | Bawendi et al. |
| 6,623,559 | B2 | 9/2003 | Huang |
| 6,630,307 | B2 | 10/2003 | Bruchez et al. |
| 6,649,138 | B2 | 11/2003 | Adams et al. |
| 6,676,729 | B2 | 1/2004 | Sun |
| 6,680,211 | B2 | 1/2004 | Barbera-Guillem et al. |
| 6,682,596 | B2 | 1/2004 | Zehnder et al. |
| 6,690,059 | B1 | 2/2004 | Lojek |
| 6,699,723 | B1 | 3/2004 | Weiss et al. |
| 6,702,957 | B2 | 3/2004 | Konrad et al. |
| 6,709,692 | B2 * | 3/2004 | Sudor ............................. 427/2.1 |
| 6,720,411 | B2 | 4/2004 | Mirkin et al. |
| 2001/0040232 | A1 | 11/2001 | Bawendi et al. |
| 2003/0186522 | A1 | 10/2003 | Duan et al. |
| 2004/0005723 | A1 | 1/2004 | Empedodes et al. |
| 2004/0026684 | A1 | 2/2004 | Empedodes |

FOREIGN PATENT DOCUMENTS

| | | |
|---|---|---|
| WO | WO 02/055186 A2 | 7/2002 |

OTHER PUBLICATIONS

Bruchez Jr. et al., "Semiconductor Nanocyrstal as Fluorescent Biological Labels", Science vol. 281, Sep. 25, 1998, 2013-2015.*
Yang et al, "Water-soluble silica-overcoated CdS:Mn/ZnS semiconductor quantum dots", J. of Chemical Physics, vol. 121, No. 15, 2004, 7421-7426.*
Alivisatos, "Perspectives on the Physical Chemistry of Semiconductor Nanocrystals," J. Phys. Chem. B 100:13226 (1996).
Bawendi et al., "Electronic Structure and Photoexcited-Carrier Dynamics in Nanometer-size CdSe Clusters," Phys. Rev. Lett. 65:1623 (1990).
Bowen Katari et al., "X-Ray Photoelectron Spectroscopy of CdSe Nanocrystals with Applications to Studies of the Nanocrystal Surface," J. Phys. Chem. 98:4109 (1994).
Bruchez, Jr. et al., "Semiconductor Nancrystals as Fluorescent Biological Labels," Science 281:2013 (1998).
Chan et al., "Size-Controlled Growth of CdSe Nanocrystals in Microfluidic Reactors," Nano Lett. 3(2):199 (2003).
Chang et al., "Preparation and Properties of Tailored Morphology, Monodisperse Colloidal Silica-Cadmium Sulfide Nanocomposites," J. Am. Chem. Soc. 116:6739 (1994).
Correa-Duarte et al., "Stabilization of CdS Semiconductor Nanoparticles Against Photodegradation by a Silica Coating Procedure," Chem. Phys. Lett. 286:497 (1998).
Cumberland et al., "Inorganic Clusters as Single Source Precursors for Preparation of CdSe, ZnSe, CdSe/ZnS Nanomaterials," Chem. Mater. 14, 1576 (2002).
Dabbousi et al., "(CdSe)ZnS Core-Shell Quantum Dots: Synthesis and Characterization of a Size Series of Highly Luminescent Nanocrystallites," J. Phys. Chem. B 101:9463 (1997).
Danek et al., "Synthesis of Luminescent Thin-Film CdSe/ZnSe Quantum Dot Composites Using CdSe Quantum Dots Passivated with an Overlayer of ZnSe," Chem. Mater. 8:173 (1996).
Dubertret et al., "In Vivo Imaging of Quantum Dots Encapsulated in Phospholipid Micelles," Science 298:1759 (2002).
Eychmuller, "Structure and Photophysics of Semiconductor Nanocrystals," J. Phys. Chem. B 104:6514 (2000).
Gaponik et al., "Thiol-Capping of CdTe Nanocrystals: An Alternative to Organometallic Synthetic Routes," J. Phys. Chem. B 106:7177 (2002).
Gerion et al., "Synthesis and Properties of Biocompatible Water-Soluable Silica-Coated CdSe/ZnS Semiconductor Quantum Dots," J. Phys. Chem. B 105:8861 (2001).
Han et al., "Quantum-Dot-Tagged Microbeads for Multiplexed Optical Coding of Biomolecules," Nature Biotechnology 19:631 (2001).
Hines et al., "Synthesis and Characterization of Strongly Luminescing ZnS-Capped CdSe Nanocrystals," J. Phys. Chem. 100:468 (1996).
Kim et al., "Type-II Quantum Dots: CdTe/CdSe (Core/Shell) and CdSe/ZnTe (Core/Shell) Heterostructures," J. Am. Chem. Soc. 125:11466 (2003).
Klarreich, "Biologists Join the Dots," Nature 413:450 (2001).
Lal et al., "Silica Nanobubbles Containing an Organic Dye in a Multilayered Organic/Inorganic Heterostructure with Enhanced Luminescence," Chem. Mater. 12:2632 (2000).
Leatherdale et al., "On the Absorbtion Cross Section of CdSe Nanocrystal Quantum Dots," J. Phys. Chem. B 106:7619 (2002).
Liz-Marzan et al., "Synthesis of Nanosized Gold-Silica Core-Shell Particles," Langmuir 12:4329 (1996).
Manna et al., "Synthesis of Soluble and Processable Rod-, Arrow-, Teardrop-, and Tetrapod-Shaped CdSe Nancrystals," J. Am. Chem. Soc. 122:12700 (2000).
Mattoussi et al., "Self-Assembly of CdSe-ZnS Quantum Dot Bioconjugates Using an Engineered Recombinant Protein," J. Am. Chem. Soc. 122, 12142 (2000).
Mulvaney et al., "Silica Encapsulation of Quantum Dots and Metal Clusters," J. Mater. Chem. 10:1259 (2000).
Murray et al., "Self-Organisation of CdSe Nanocrystallites into Three-Dimensional Quantuum Dot Superlattices," Science 270:1335 (1995).
Murray et al., "Synthesis and Characterization of Nearly Monodisperse CdE (E=sulfur, selenium, tellurium) Semiconductor Nanocrystallites," J. Am. Chem. Soc. 115:8706 (1993).
Niemeyer, "Nanoparticles, Proteins, and Nucleic Acids: Biotechnology Meets Materials Science," Angew. Chem. Int. Ed. 40:4128 (2001).
Norris et al., "Measurement of the Size Dependent Hole Spectrum in CdSe Quantum Dots," Phys. Rev. Lett. 72:2612 (1994).
Pathak et al., "Hydroxylated Quantum Dots as Luminescent Probes for In Situ Hybridization," J. Am. Chem. Soc. 123:4103 (2001).
Peng et al., "Formation of High-Quality CdTe, CdSe, and CdS Nanocrystals Using CdO as Precursor," J. Am. Chem. Soc. 123:183 (2001).
Rogach et al., "Raisin Bun-Type Composite Spheres of Silica and Semiconductor Nancrystals," Chem. Mater. 12:2676 (2000).
Schroedter et al., "Biofunctionalization of Silica-Coated CdTe and Gold Nanocrystals," Nano. Lett. 2(12):1363 (2002).
Selvan et al., "Fabrication of Inorganic Nanocomposites Using Self-Assembly and Sol-Gel Processing," in Nanoscale Materials, Kluwer Academic Publishers, 247-272 (2003).
Selvan et al., "Synthesis of Tunable, Highly Luminescent QD-Glasses Through Sol-Gel Processing," Adv. Mater. 13:985 (2001).
Sinani et al., "Collagen Coating Promotes Biocompatability of Semiconductor Nanoparticles in Stratified LBL Films," Nano. Lett. 3(9):1177 (2003).

Talapin et al., "Dynamic Distribution of Growth Rates within the Ensembles of Colloidal II-VI and III-V Semiconductor Nancrystals as a Factor Governing Their Photoluminescence Efficiency," J. Am. Chem. Soc. 124:5782 (2002).

Tian et al., "Coupled Composite CdS-CdSe and Core-Shell Types of (CdS)CdSe and (CdSe)CdS Nanoparticles," J. Phys. Chem. 100:8927 (1996).

Wang et al., "Photochemical Incorporation of Silver Quantum Dots in Monodisperse Silica Colloids for Photonic Crystal Applications," J. Am. Chem. Soc. 123:12528 (2001).

International Search Report dated May 12, 2006 for PCT/US2005/026131.

* cited by examiner

IGEPAL REVERSE MICELLES

QDs IN IGEPAL REVERSE MICELLES
INTERACTION OF P=O (TOPO) WITH PEO (IGEPAL)

QDs AT WATER/OIL INTERFACE IN MICROEMULSION

COATED WATER-SOLUBLE NANOPARTICLES COMPRISING SEMICONDUCTOR CORE AND SILICA COATING

BACKGROUND OF INVENTION

1. Field of the Invention

The invention relates to nanoparticles and methods for making nanoparticles, and in particular, to semiconductor nanocrystals that exhibit improved hydrophilicity.

2. Discussion of Related Art

Nanoparticles are microscopic particles of matter having dimensions on the nanometer scale. Of particular interest are a class of nanoparticles known as semiconductor nanocrystals, or quantum dots, that exhibit properties that make them particularly useful in a variety of applications. Because of quantum confinement effects, semiconductor nanocrystals can exhibit size-dependent optical properties. The particles give rise to a class of materials whose properties include those of both molecular and bulk forms of matter. When these nanoparticles are irradiated, more energy is required to promote the electrons to a higher state, leading to an increase in energy release in the form of photons and light emission in a color that is characteristic of the material. The resulting photons that are released typically exhibit a shorter wavelength than those released from a bulk form of the same material. The quantum confinement of electrons and holes in three dimensions contributes to an increasing effective band gap with decreasing nanocrystal size. Therefore, smaller nanocrystals typically exhibit shorter emitted photon wavelength. For example, nanocrystals of cadmium selenide (CdSe) can emit across the entire visible spectrum when the size of the crystal is varied over the range of from two to six nanometers.

Another aspect of semiconductor nanocrystals is that crystals of a uniform size typically are capable of a narrow and symmetric emission spectrum regardless of excitation wavelength. Thus, if nanocrystals of different sizes are employed, different emission colors may be simultaneously obtained from a common excitation source. These capabilities contribute to the nanocrystals' potential as diagnostic tools, for example, as fluorescent probes in biological labeling and diagnostics. These nanocrystals, or quantum dots, exhibit high emission stability over long periods of time, thus providing advantages over conventional biological probing dyes. One class of semiconductor nanocrystals are the cadmium chalcogenides. These include, for example, cadmium selenide and cadmium telluride nanoparticles.

It is known that improved quantum yields of semiconductor nanocrystals can be obtained by passivating the nanocrystals by reducing the incident of surface non-radiative recombination sites. Surface passivation can be achieved, for example, by coating a material around the nanocrystals. See, e.g., Alivisatos et al., U.S. Pat. No. 6,255,198. The coatings can be inorganic or organic although inorganically coated quantum dots are typically more robust and exhibit less degradation of photo luminescence quantum yield in solution than do organically passivated quantum dots.

For semiconductor nanocrystals to be useful in biological applications, it is preferred that the crystals are water soluble, photo-stable and non-toxic. Some quantum dots may exhibit water solubility but are typically not photo-stable and are toxic. Other nanocrystals have been coated, for example, with short chain water soluble molecules, such as thiols, to render the nanocrystals soluble. However, these organically coated quantum dots have been shown to be unstable and exhibit deteriorating photo-luminescent properties. Others, such as Bawendi et al. in U.S. Pat. Nos. 6,319,426 and 6,444,143, hereby incorporated by reference, have synthesized semiconductive nanocrystals having an organic layer that also includes linking groups for the attachment of hydrophilic groups that can provide improved water solubility.

Some have proposed coating nanocrystals using silicate as a precursor. These methods use silane as a surface primer to deposit a thin shell of silica in water. The silica shell can then be thickened using the Stöber method. These procedures, however, are complicated and time-consuming. Others have used microemulsions as a technique for silica coating. In particular, using reverse microemulsions, monodispersed silica particles can be synthesized. Encapsulation of nanoparticles within silica can lead to an enhancement in chemical stability and photo-stability. This has been done in nanoparticles having a zinc sulfide (ZnS) core/two photon dye/silica particles and the encapsulated dye within the silica shell has exhibited enhanced luminescence and lifetime. However, synthesized TOPO semiconductor nanocrystals are water insoluble and thus silica cannot be precipitated with the nanocrystals within the aqueous domains of the microemulsion.

SUMMARY OF INVENTION

The invention is directed, in part, to nanoparticles, soluble nanoparticles and methods for making nanoparticles.

In one aspect, a coated nanoparticle is provided, the nanoparticle comprising a core comprising a semiconductor material, a non-semi-conductor passivation layer contacting at least a portion of the core, and a non-organic shell encapsulating at least partially the core and the passivation layer.

In another aspect, a method of making a water-soluble nanoparticle is provided, the method comprising contacting an amine with a nanoparticle to modify the nanoparticle surface, suspending the nanoparticle in an aqueous-in-nonaqueous emulsion, introducing a silica precursor to the emulsion, and polymerizing the silica precursor to form a silica shell that at least partially encapsulates the nanoparticle.

In another aspect, a semiconductor nanocrystal solution is provided, the solution comprising an aqueous solution having a pH of less than about 8.0, a plurality of semiconductor nanocrystals dissolved in the aqueous solution wherein at least 90% of the semiconductor nanocrystals, by weight, remain dissolved for greater than 6 hours.

In another aspect, a semiconductor nanocrystal is provided wherein the nanocrystal is soluble in water at a pH of less than about 8.0.

In another aspect, a nanoparticle is provided, the nanoparticle comprising a silica shell encapsulating a core, the silica shell including polyethylene glycol, or a derivative thereof.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
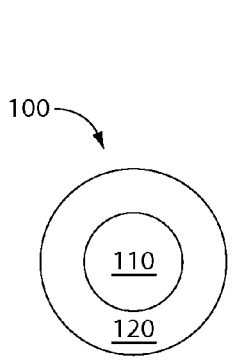
FIG. 1 is a schematic illustration of a silica-coated CdSe semiconductor nanocrystal.

The present invention relates to nanoparticles, and methods of making nanoparticles, that can exhibit improved quantum yield, and/or improved water solubility, and/or improved photo-stability, and/or improved photo-luminescence. The nanoparticles may include a non-semiconductor and/or non-metallic and/or non-inorganic passivation layer. The passivation layer may be amorphous, i.e., it lacks a crystalline structure. One preferred form of amorphous passivation layer is one comprising a material such as an amino silane. In addition, the nanoparticles may include a silica shell that partially or totally encapsulates the nanoparticle core. In some cases, the silica shell may be derivatized with, for example, polyethylene glycol (PEG) or other materials that provide improved characteristics, such as water solubility. Nanoparticles of improved quantum yield, stability, solubility and/or biocompatibility can lead to improved methods, such as, for example, medical diagnostics.

The term "nanoparticle" is used herein as it is known in the art and typically refers to particles having a dimension of less of 100 nanometers. One class of nanoparticles are the "semiconductor nanocrystals" or "quantum dots" that can provide unique emission spectra dependent, in part, on the size of the specific particle.

A "passivation" layer is a material associated with the surface of a semiconductor nanocrystal that serves to eliminate energy levels at the surface of the crystal that may act as traps for electrons and holes that degrade the luminescent properties of the nanocrystal. An example is a ZnS layer surrounding a CdSe semiconductor nanoparticle. Passivation layers result in improved quantum yields when compared to untreated particles.

An "emulsion" is a dispersion of a non-aqueous solvent and an aqueous solvent. A "reverse emulsion" or "aqueous in non-aqueous emulsion" is a dispersion of discrete areas of aqueous solvent (aqueous phase) within a non-aqueous solvent.

A "shell" is a layer that surrounds or partially surrounds a nanoparticle core and in some cases may be chemically bound to the nanoparticle, such as by ionic or covalent bonding, and in other cases is not bound to the nanoparticle core. The shell forms part of the nanoparticle.

A "surfactant" is a material exhibiting amphiphilic properties and is used herein as it is commonly used in the art, e.g., for introducing hydrophobic species to hydrophilic environments.

The term "water soluble" is used herein as it is commonly used in the art to refer to the dispersion of a nanoparticle in an aqueous environment. "Water soluble" does not mean, for instance, that each material is dispersed at a molecular level.

A nanoparticle can be composed of several different materials and still be "water soluble" as an integral particle.

A "biological fluid" is a fluid present in or obtained from animal or plant and is typically aqueous in nature. Biological fluids include, for example, blood, urine, lymph, saliva, sweat, and tears.

A "precursor" is a substance that can be transformed into a second substance that exhibits different properties from the first. For example, a monomer is a polymer precursor if it can be transformed into a polymer.

In one aspect, a nanoparticle includes a shell that encapsulates or partially encapsulates the nanoparticle. In some embodiments, the shell is not chemically bound to the nanoparticle and yet may contain the nanoparticle by encapsulation. Thus, the nanoparticle and shell may be devoid of ionic bonds and/or covalent bonds between the two. The shell may be non-organic and may be a silicon polymer such as silica. A non-organic shell is one that is not based on carbon and polymers of carbon, but nonetheless may, in some cases, include carbon atoms.

FIG. 1 shows schematically one embodiment of the invention. Nanoparticle 100 includes a core 110 and a shell 120. Shell 120 can be chemically bound or unbound to the core 110. The core can be a semiconductor material such as a semiconductor nanocrystal (quantum dot). The shell may be generally spherical and may have a mean diameter that is about 1.5×, 2×, 5×, 10× or >10× the diameter of the core. Typically, a single core is encapsulated by a single shell although in some embodiments, two or more cores may be contained within a single shell.

In another aspect of the invention, a semiconductor nanocrystal includes a passivation layer. In some embodiments, the passivation layer may be of a material that is non-conductive and/or non-semiconductive. For example, the passivation layer may be of a material that does not exhibit a higher band gap than a nanocrystal which it surrounds. In specific embodiments, the passivation layer may be non-ionic and non-metallic. A non-conductive material is a material that does not transport electrons when an electric potential is applied across the material.

Figure 3:
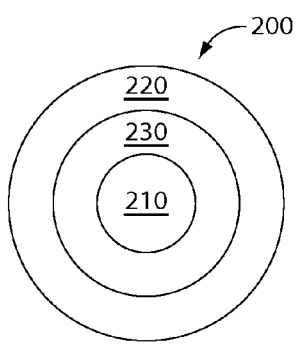
FIG. 3 is a schematic illustration of a nanoparticle including a shell and a passivation layer.

FIG. 3 illustrates schematically and not to scale a nanoparticle 200 including a core 210, a surface passivation layer 230 and a shell 220. The shell may be organic or non-organic and may comprise a non-organic polymer such as silica. In this embodiment, passivation layer 230 is a non-semiconductor and is preferably an amino ($NH_2$) silane, such as aminopropyl trimethoxysilane (APS). The inclusion of this passivation layer has been shown to provide a quantum yield of about 10-30% or 10-20% in aqueous media.

Figure 4:
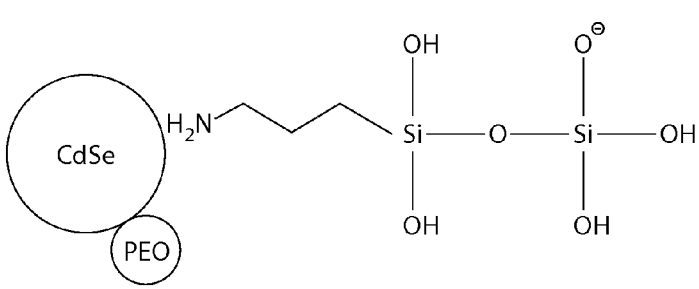
FIG. 4 illustrates a nanoparticle core in contact with an amino silane surface cap and a surfactant.

FIG. 4 illustrates schematically an amino silane modifying the surface of a nanocrystal core to form a passivation layer. The passivation layer can be comprised of, or consist essentially of, a compound exhibiting a nitrogen-containing functional group, such as an amine. The amine may be bound directly or indirectly to one or more silicon atoms such as those present in a silane or other silicon polymer. The silanes may include any additional functional group such as, for example, alkyl groups, hydroxyl groups, sulfur-containing groups, or nitrogen-containing groups. Compounds comprising the passivation layer may be of any size but typically have a molecular weight of less than about 500 or less than about 300. The preferred class of compounds are the amino silanes and in some embodiments, amino propyl trimethoxysilane (APS) can be used. The use of APS in semiconductor nanocrystals has been shown to provide passivation and to improve quantum yields to a level comparable to the improvements obtained by the use of higher band gap passivation layers such as those made of zinc sulfide (ZnS).

Nanoparticles including a silica shell will, of course, be of greater dimensions than a similar nanoparticle absent the shell. For example, nanoparticles of the invention may exhibit mean diameters of less than 100 nm, less than 50 nm, or less than or equal to about 25 nm. In other embodiments, the mean diameter of the nanoparticle including the shell may be greater than 5 nm, greater than 10 nm, greater than 20 nm, or greater than or equal to about 25 nm.

In some embodiments, a silica shell can be functionalized or derivatized to include compounds, atoms, or materials that can alter or improve properties such as water solubility, water stability, photo-stability and biocompatibility. For example, a silica shell can include moieties such as polyethylene glycol (PEG) and other glycols. These nanoparticles, with and without PEG, have been shown to be non-toxic to living cells for extended periods, and it is believed that the nanoparticles are also non-toxic in vivo due, at least in part, to the isolation of the toxic core within the polymerized silica shell.

Figure 2:
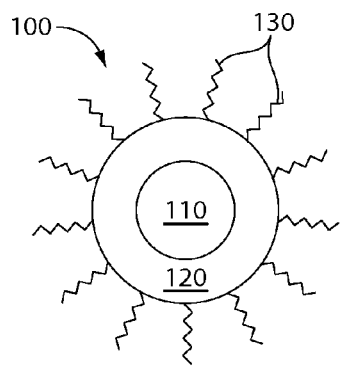
FIG. 2 is a schematic illustration of a coated nanocrystal with a shell including long chain hydrophilic species.

As shown in FIG. 2, a shell 120, that may be non-organic, can include hydrophilic species 130 that can provide greater hydrophilicity to the nanoparticle. Hydrophilic species 130 can be, for example, a polyethylene glycol (PEG) or a derivative of polyethylene glycol. Derivatives include, but are not limited to, functionalized PEGs, such as amine, thiol and carboxyl functionalized PEG. The hydrophilic species 130 is associated with the shell 120 and can be chemically bound to the shell 120 or can be, for example, physically trapped by the shell material. Preferably, hydrophilic species 130 includes a portion that can be chemically bonded to the shell and a second portion that provides hydrophilicity and may extend outwardly from the surface of the shell.

Presence of these glycols can impart superior water solubility characteristics to the nanoparticles while being biocompatible and nontoxic and can, in some instances, provide for better dispersion of the nanoparticles in solution. For example, by integrating PEG into the silica shell, the semiconductor nanocrystal may be rendered water soluble at pHs of less than 8, less than or equal to 7.5, less than or equal to 7 or less than or equal to 6.5. Thus, these nanoparticles may be water soluble at neutral or below neutral pHs and thus may be biocompatible and appropriate for use in biological fluids such as blood and in vivo. In some embodiments, the inclusion of PEG into the silica shell provides for a nanoparticle that can remain in solution for a period of greater than 1 hour, greater than 6 hours, greater than 12 hours or greater than 1 day. In addition, the presence of PEG or related compounds in the silica shell can provide for a nanoparticle exhibiting a reduced propensity to adsorb protein, cells, and other biological materials. This means that, for example, when used in vivo, the particles can stay in solution for a longer period of time than do similar particles, thus allowing for increased circulation and improved deliverability to intended targets.

Figure 5:
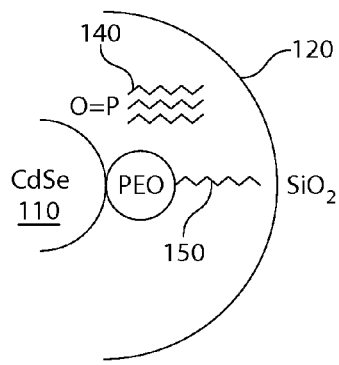
FIG. 5 illustrates a nanoparticle core with exchanging surfactants and a silica shell.
Figure 6A:
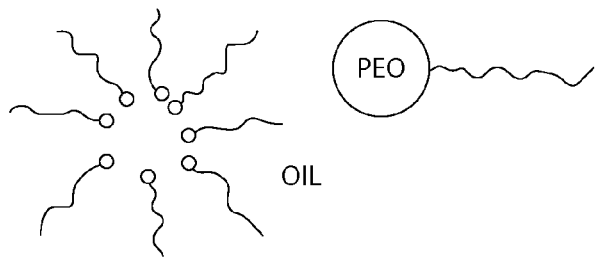
FIGS. 6a-6c provide a schematic diagram describing the encapsulation of hydrophobic semiconductor nanocrystals within the aqueous domains of a reverse microemulsion, using the interaction of hydrophilic groups (polar ends) of two different surfactants, TOPO and IGEPAL.
Figure 6B:
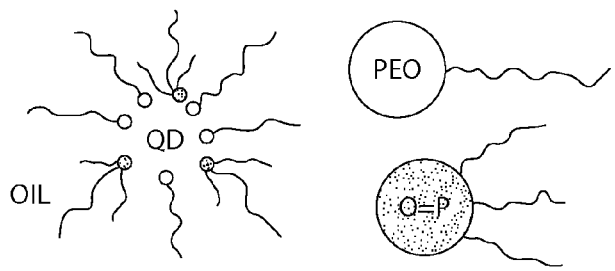
Figure 6C:
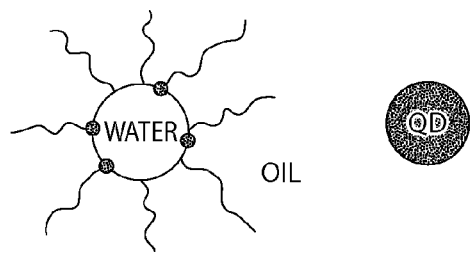
Figure 7A:
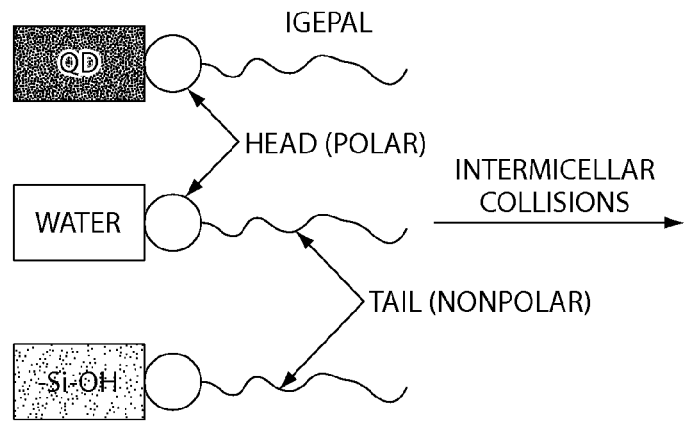
FIGS. 7a-7c provide a schematic diagram describing steps that can result in the encapsulation of hydrophobic semiconductor nanocrystals (QDs) within a silica shell. The steps include micellar collisions, nucleation and polymeric growth of monomers.
Figure 7B:
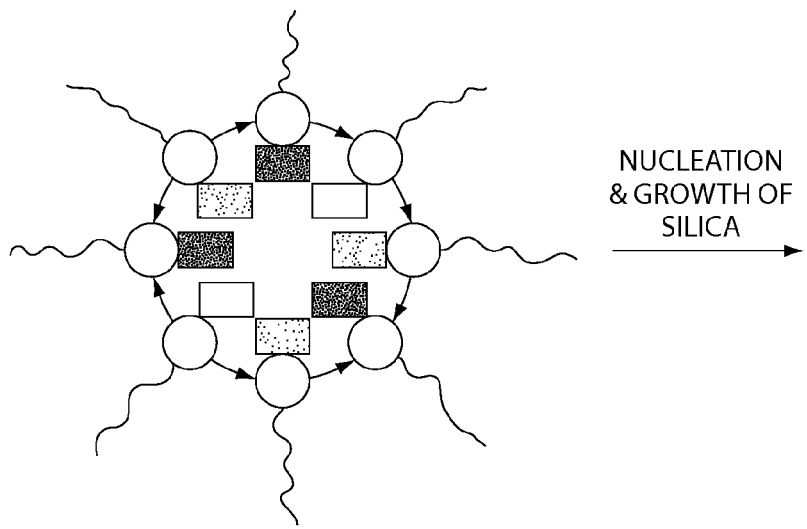
Figure 7C:
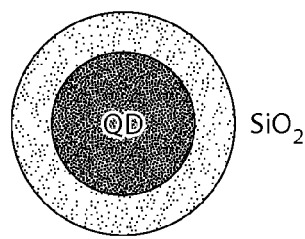

One embodiment is shown in FIG. 5 that illustrates schematically the formation of a silica shell 120 around a CdSe core 110. Portions of two surfactants, TOPO 140 and IGEPAL 150, are shown. TOPO includes the hydrophilic group phosphine oxide and IGEPAL includes the hydrophilic group PEO. The source of the IGEPAL 150 is the reverse microemulsion (aqueous in non-aqueous) and the source of the TOPO is the TOPO capped semiconductor nanocrystal. FIGS. 6a-6c illustrate how the reverse micelles can present the nanocrystal cores for encapsulation at the water/oil interface. Thus, while the nanocrystals may be transported to the aqueous phase, the formation of the silica polymer tends to occur around the nanocrystals at the aqueous/non-aqueous interface. FIGS. 7a-7c illustrate the formation of a silica shell around a nanoparticle core at the oil/water (cyclohexane/water) interface.

The aqueous in non-aqueous microemulsion can be produced using a variety of non-polar solvents. Preferably the non-polar solvent is a hydrocarbon and may be an aliphatic hydrocarbon and in a more preferred embodiment is a non-aromatic cyclic hydrocarbon such as cyclopentane, cyclohexane or cycloheptane.

In one embodiment, a semiconductor nanocrystal including a core of a cadmium chalcogenide is coated with a passivation layer comprising an amine. The core, that may include cadmium selenide or cadmium telluride, for example, can be made using methods known to those skilled in the art. An aqueous in non-aqueous reverse micro emulsion can be prepared, using for example, an ionic or non-ionic surfactant. Non-ionic surfactants include, for example, polyphenyl ethers, such as IGEPAL CO-520, while ionic surfactants include, for example, dioctyl sulfosuccinate sodium salt (AOT). As conventionally prepared, the calcium chalcogenide core is typically presented with a trioctyl phosphine oxide (TOPO) surfactant. TOPO includes a hydrophilic end comprising phosphine oxide while IGEPAL includes a hydrophilic end comprising polyoxyethylene (PEO). After introduction of the TOPO semiconductor nanocrystals into the reverse emulsion, the TOPO can be partially or completely exchanged for IGEPAL due, in part, to the much higher concentration of IGEPAL in the reverse emulsion.

Upon the exchange of TOPO for IGEPAL, the semiconductor nanocrystal cores are amenable to the aqueous domains in the reverse emulsion and a sol-gel precursor, such as tetraethylorthosilicate (TEOS) can be polymerized using methods known to those skilled in the art, around the core to produce a silica shell. The resulting nanostructure includes a core of a cadmium chalcogenide, a passivation layer of an amino silane such as APS and a hydrophilic shell, such as a shell of polymerized silica. Surfactants other than IGEPAL may be used and may be varied, in part, depending upon the core material, how the nanoparticle core is capped and the reverse emulsion that is used. Preferred surfactants are those that can be exchanged for TOPO or other surfactants that are used to cap the core and that also provide enough hydrophilicity to draw the core into aqueous portions of the microemulsion, thus providing an environment for the formation of the silica shell.

In another aspect, a method of making a nanoparticle including a silica shell modified to improve biocompatibility and/or water solubility is provided. For example, in some embodiments a PEG modified silica shell can be formed around a nanoparticle. The nanoparticle core may be a semiconductor nanocrystal or other nanoparticle. As described above, the nanoparticle core may be introduced into a reverse micro-emulsion (aqueous in non-aqueous emulsion) to prepare it for encapsulation. In another step, a base such as ammonia ($NH_4OH$) including a glycol such as polyethyleneglycol monomethylether (PEG-m) can be dissolved into the microemulsion. The PEG may be of any molecular weight, but it is preferably of a molecular weight of greater than 1,000 and less than 20,000 and in some embodiments, is in a range of between 5,000 and 10,000. A sol-gel precursor such as TEOS can then be added and the mixture can be stirred allowing the PEG to be incorporated into the forming silica shell. The resulting silica shell derivatized with PEG can provide for improved quantum yield, improved water solubility, improved biocompatibility in a reduced propensity to coagulate.

In one embodiment, ammonia and PEG are stirred into the microemulsion before a sol-gel precursor such as TEOS is added. After addition of the sol-gel precursor, the microemulsion can be stirred continuously until a preferred amount of silica polymerization has taken place. During this time, the PEG is incorporated into the silica shell and can alter the properties of the silica shell by, for example, increasing hydrophilicity, altering the nanoparticle's propensity to adsorb materials such as proteins in cells, and can increase repulsion forces between particles, providing for an extended period of suspension of the particles without coalescing.

The amount of water (29.5% aqueous $NH_4OH$) in the aqueous in non-aqueous (reverse) microemulsion can be varied based upon the specific reaction that is desired. For example, in some embodiments the amount of water in the reverse microemulsion is between 0.2 and 0.5 percent by volume. In preferred embodiments, the amount of water is between 0.3 and 0.4 percent by volume and in some embodiments it has been found that quantum yield can be maximized when the amount of water in the reverse microemulsion is about 0.3 percent by volume.

The amount of sol-gel precursor added to the microemulsion can also affect the properties of the nanoparticle. For example, while an increase in the amount of sol-gel precursor does not appear to increase the shell thickness, an increase in the amount of sol-gel precursor does appear to improve this sphericity as well as the monodispersity of the particles. In some embodiments, quantum yield is also improved with higher concentrations of sol-gel precursor. For example, see FIGS. 20A and 20B.

EXAMPLES

Example 1

Preparation of Silica-Coated ZnS-capped CdSe Nanocrystals (CdSe/ZnS/$SiO_2$) in Reverse Microemulsion (Aqueous in Non-aqueous Emulsion)

CdSe/ZnS semiconductor nanocrystals with excess TOPO without any surface modification were prepared according to literature procedures (Hines et al., "Synthesis and Characterization of Strongly Luminescing ZnS-Capped CdSe Nanocrystals" J. Phys. Chem. 100, 468-471, 1996. Dabbousi et al., "(CdSe)ZnS Core-Shell Quantum Dots: Synthesis and Characterization of a Size Series of Highly Luminescent Nanocrystallites" J. Phys. Chem. B 101, 9463-9475, 1997.). The particles had luminescence quantum yields of 10-25% and emission at 625 nm (FWHM=30 nm). The particles were precipitated once from methanol to remove excess TOPO and trioctylphosphine oxide (TOP). Inverse micelles were prepared using a non-ionic surfactant such as Igepal CO-520 and cyclohexane as solvent.

FIGS. 6 and 7 depict the schemes of the transformation of hydrophobic semiconductor nanocrystal into aqueous domains of the reverse microemulsion and silica coating, respectively. Typically, core-shell semiconductor nanocrystals passivated with TOPO and dissolved either in butanol or n-hexane were injected into the reverse micelles. This was followed by the addition of TEOS and was allowed to stir for 1 hour. Addition of ammonia resulted in a stable water-in-oil reverse microemulsion. The resulting solution was stirred for 24 hours, which resulted in homogeneous silica deposition. Due to the large excess of Igepal, the TOPO ligand was exchanged for Igepal in cyclohexane and the semiconductor nanocrystals became more hydrophilic. The nanocrystals were then solubilized by water through exchange of the Igepal-capped semiconductor nanocrystals with Igepal-capped aqueous domains.

Example 2

Figure 8:
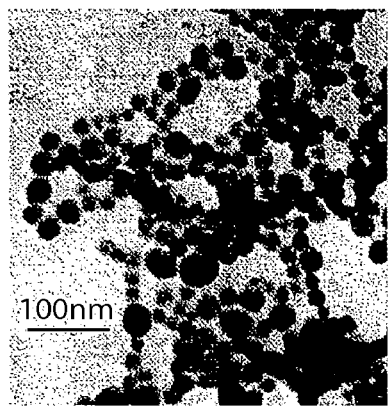
FIG. 8 is a photocopy of a transmission electron micrograph (TEM) of CdSe/ZnS QD-silica core-shell structures having a diameter of about 6 nm encapsulated within an approximately 22 nm silica shell using a microemulsion technique. The majority of single QDs are encapsulated within a single silica shell.
Figure 9:
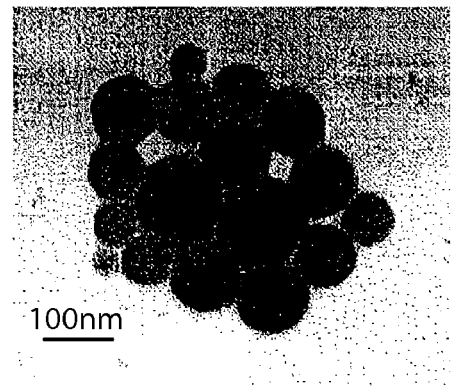
FIG. 9 is a photocopy of a transmission electron micrograph (TEM) of CdSe/ZnS QD-silica core-shell structures having a diameter of about 6 nm encapsulated within an approximately 100 nm silica in the microemulsion.
Figure 10:
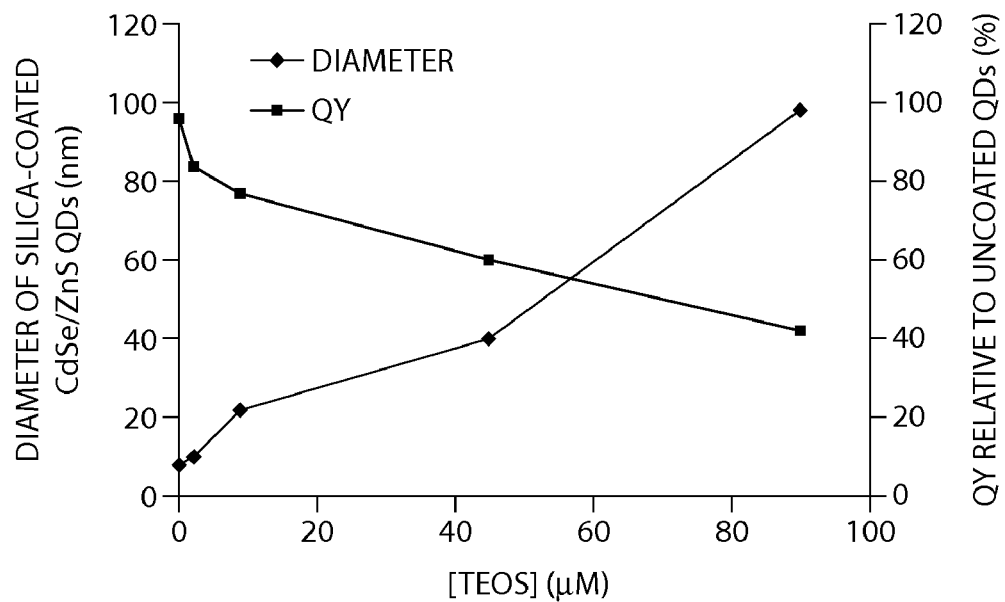
FIG. 10 illustrates graphically the effect of TEOS concentration on silica shell thickness and also on the quantum yield (QY) relative to uncoated CdSe/ZnS nanoparticles.

TEM Characterization of Silica-Coated ZnS-capped CdSe Nanocrystals (CdSe/ZnS/SiO$_2$) in Reverse Microemulsion Electron microscopy revealed that the majority (>90%) of nanocrystals are encapsulated as single particles within a silica shell (FIG. 8). The average total diameter of nanocrystal/Silica is ~22 nm. FIG. 9 shows the encapsulation of nanocrystals within ca. 100 nm silica in the reverse microemulsion. Varying the amount of water and ammonia in the microemulsion also affects the shell thickness, since this alters the aqueous domain size. The silica shell thickness can be increased by increasing the TEOS concentration as shown in FIG. 10. The higher the concentration of TEOS the larger is the silica diameter. Increase in the size of silica lowers the emission intensity and QY. The total diameter of coated nanocrystals affect the QY relative to the uncoated nanocrystals, which is also shown in FIG. 10.

Example 3

Figure 11:
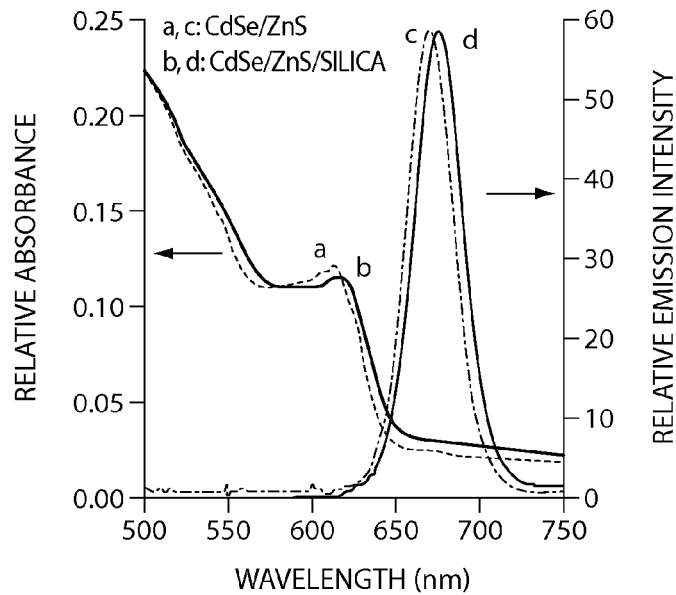
FIG. 11 shows the absorption and emission spectra of CdSe/ZnS semiconductor nanoparticles with and without silica coating.

Emission Characteristics of Silica-Coated ZnS-capped CdSe Nanocrystals (CdSe/ZnS/SiO$_2$) in Water Silica-coated nanocrystals in the microemulsion were centrifuged at 18000 rpm for 30 minutes and the pellet was washed with cyclohexane twice and dispersed in an alkaline aqueous solution of pH 8-9. The silica-coated nanocrystals in water were characterized by UV-visible absorption spectroscopy and fluorescence spectroscopy. FIG. 11 shows the absorption and fluorescence spectra of the CdSe nanocrystals before and after silica coating. UV-visible and photoluminescence spectra show that there is a 5 nm red-shift for CdSe/ZnS/SiO$_2$ in water, in comparison to the CdSe/ZnS nanocrystals in the parent solution, butanol. Silica-coated semiconductor nanocrystals in water showed remarkable colloidal stability over a period of several months.

Figure 12:
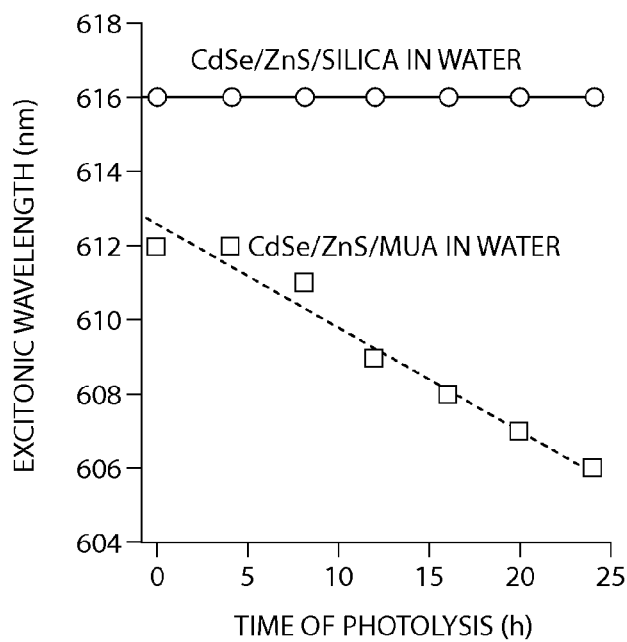
FIG. 12 graphically compares the photo-stability of silica-coated CdSe/ZnS semiconductor nanocrystals with organic-coated semiconductor nanoparticles.

Silica-coated nanocrystals showed remarkable photostability. The nanocrystals in water and in butanol were exposed to UV irradiation (335 nm cut-off filter). About 85% of the quantum yield was retained after 24 hours for the coated particles in water, where as the parent semiconductor nanocrystal solution virtually lost all luminescence after 24 hours. We also compared the results with those dots in water capped by mercaptoundecanoic acid (MUA). MUA-capped semiconductor nanocrystals in water exhibited initial photo-brightening and then photo-dissolution over a period of 24 hours. The exciton absorption peak position is plotted against time of photolysis in FIG. 12. The peak position remains constant at 616 nm for silica-coated semiconductor nanocrystals, indicating that the dots are photostable over extended periods of photolysis time. On the contrary, the nanocrystals capped with MUA show photo-dissolution as exemplified by blue-shifts in the exciton position over 24 hours of photolysis.

Example 4

Preparation of TOPO-capped CdSe Semiconductor Nanocrystals and Interaction of Surfactants in IGEPAL Reverse Micelles The following experiment was run to demonstrate that the TOPO on a TOPO capped nanocrystal could be exchanged for a more hydrophilic surfactant that can alter the hydrophilicity of the nanoparticle.

CdSe semiconductor nanocrystals with excess TOPO without any surface modification were prepared according to literature procedures (Peng et al., "Formation of High-Quality CdTe, CdSe, and CdS Nanocrystals Using CdO as Precursor" J. Am. Chem. Soc. 123, 183-184, 2001). The particles had luminescence quantum yields of 10-20% and emissions at 550-600 nm (FWHM=30-40 nm). The particles were precipitated once from methanol to remove excess TOPO and trioctylphosphine oxide (TOP). Inverse micelles were prepared using the non-ionic surfactant IGEPAL CO-520 (polyoxyethylene nonylphenyl ether), at 5%, by weight, and cyclohexane as solvent.

Emission experiments showed that TOPO-capped nanocrystals were exchanged by IGEPAL. Changes in emission intensity and emission wavelength for nanocrystals in IGEPAL micelles in comparison with those nanocrystals in cyclohexane are due to the surface ligand exchange reactions between TOPO and IGEPAL.

Example 5

Preparation of Silica-Coated Nanocrystals (CdSe/SiO$_2$) in IGEPAL Reverse Microemulsion (Aqueous in Non-aqueous Emulsion)

CdSe nanocrystals passivated with TOPO were precipitated with methanol once and the precipitate was dried under nitrogen in order to remove the methanol. To the precipitate, cyclohexane was added and vortexed until the solution became clear. The semiconductor nanocrystals were introduced into the reverse micelles of an aqueous in non-aqueous emulsion made with 0.5 g IGEPAL and 10 ml cyclohexane, and stirred for 30 minutes. Then 100 μl of 29.5% NH$_4$OH was added and stirred for another 1 hour. Finally, TEOS was added at different concentrations and the stirring continued for 24 hours. Aliquots of samples were taken at different periods of coating times ranging from 1 to 24 hours, and emission spectra were recorded.

Figure 13A:
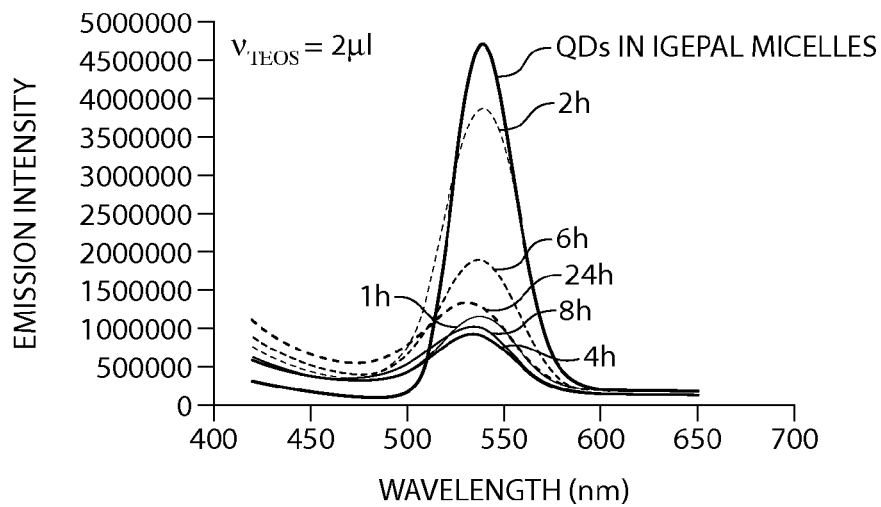
FIGS. 13a-c illustrate the changes of emission intensity of core semiconductor nanocrystals with various silica coating times. Volume of TEOS ($V_{TEOS}$) added into the microemulsion is indicated.
Figure 13B:
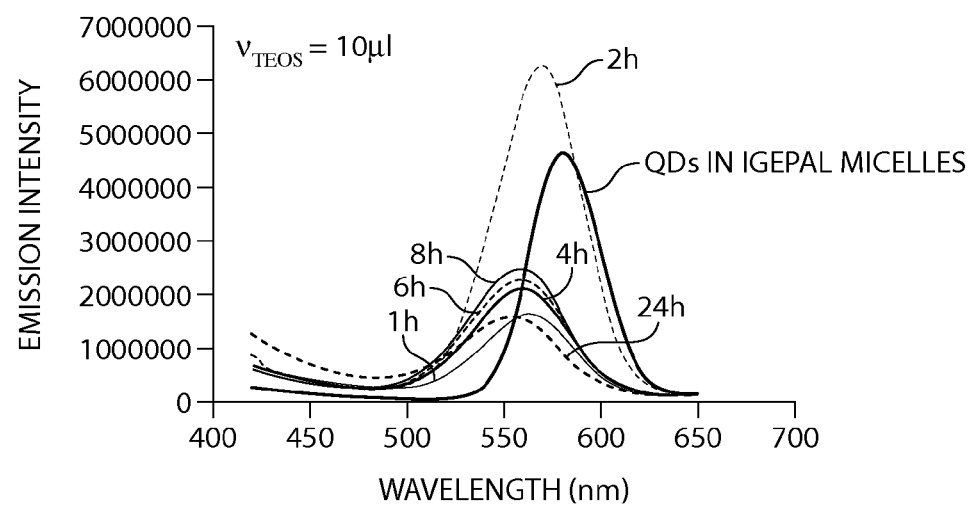
Figure 13C:
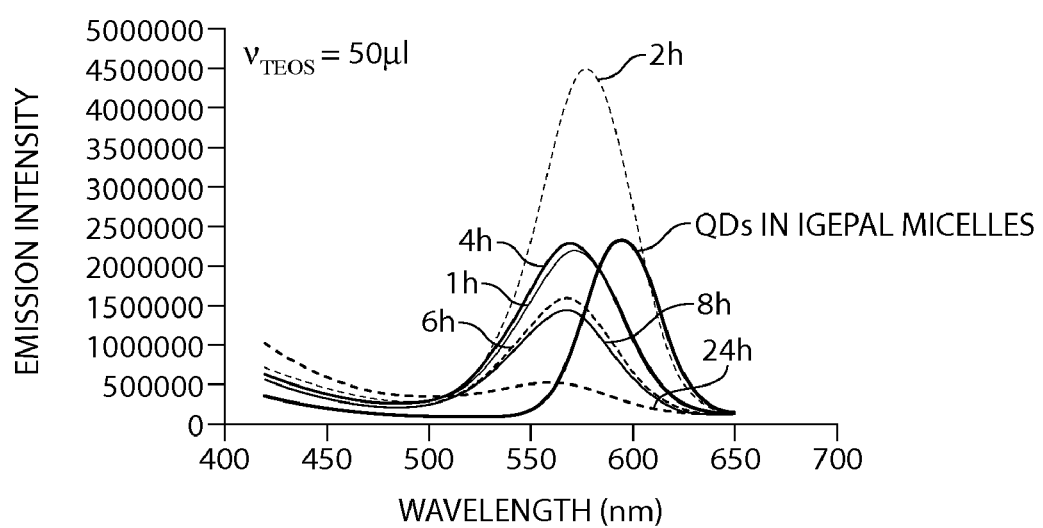
Figure 14A:
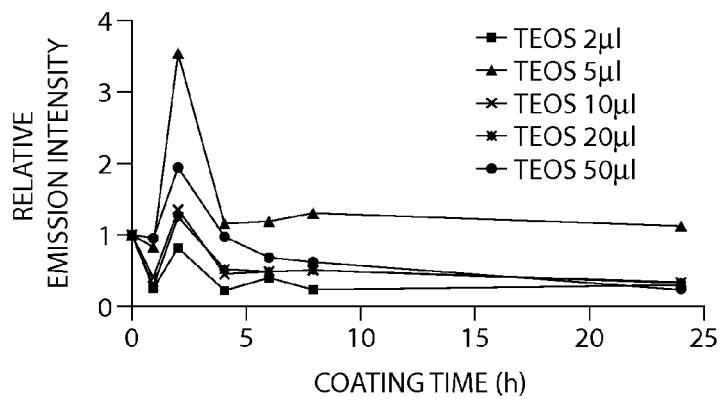
FIG. 14a shows the relative emission intensity versus coating time at various TEOS concentrations for core semiconductor nanocrystals.

FIGS. 13a-13c depict the effect of TEOS concentration and silica coating time on the emission characteristics. For comparison, the emission spectra of nanocrystals in IGEPAL micelles (no silica coating) are shown. It is clear that the full width at half maximum (FWHM) of the emission peak is increased with an increase in coating time. In FIG. 14a the relative emission intensity is plotted against coating time at various TEOS concentration. Results show that the emission intensity increases at 2 hours of silica coating after an initial decrease at 1 hour, and that a further increase in coating time at 4 hours decreases the emission intensity, which remains saturated with further increase in coating time. The initial increase in the intensity at 2 hours is apparently due to silica formation when ammonia adsorption occurs on the surface sites of the nanocrystals. The decrease in emission intensity is presumably due to the acidity of the silanol groups that quench ammonia basicity by a desorption process at higher coating times (FIG. 14a).

Figure 14B:
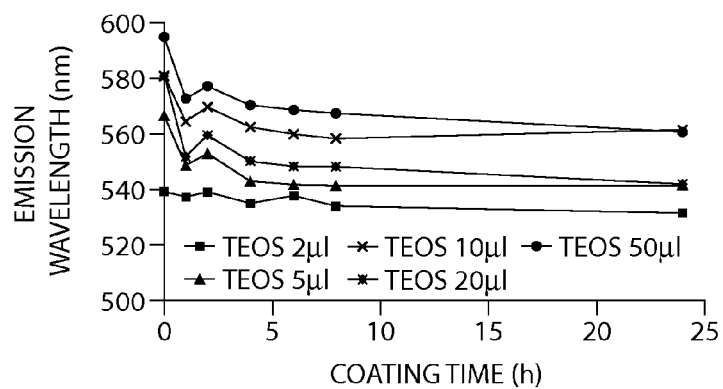
FIG. 14b shows the emission wavelength versus coating time at various TEOS concentrations for core semiconductor nanocrystals.
Figure 14C:
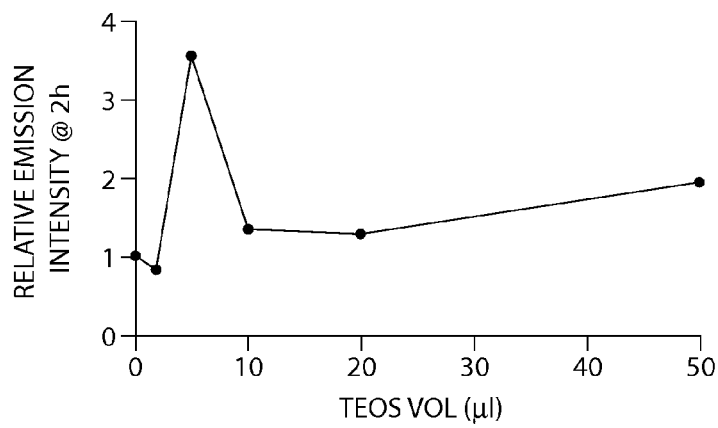
FIG. 14c shows the relative emission intensity versus TEOS concentrations at 2 hours coating time for core semiconductor nanocrystals.

FIG. 14b shows the effect of coating time on the emission wavelength at different TEOS concentrations and different particles sizes. In all the cases, silica-coated nanocrystals exhibit a blue shift in comparison with naked (uncoated) dots. This implies that IGEPAL-capped nanocrystals are exchanged for silica-coated nanocrystals. The surface exchange reaction accounts for the blue shift. The best conditions for silica coating are found to employ 5 µl TEOS in a total volume of 10 ml microemulsion and 2 hours of coating time (FIG. 14c).

Example 6

Figure 15A:
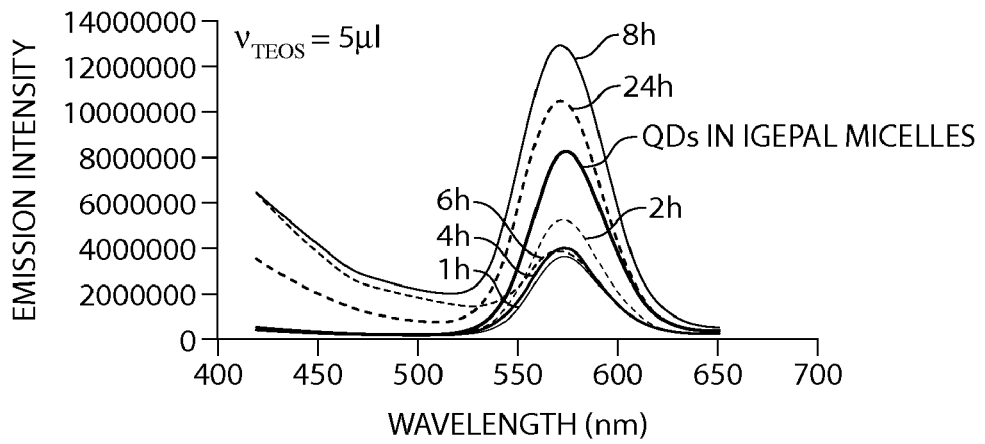
FIGS. 15a-c illustrate the changes of emission intensity of APS-modified core semiconductor nanocrystals upon various silica coating times. Volume of TEOS ($V_{TEOS}$) added into the microemulsion is indicated.
Figure 15B:
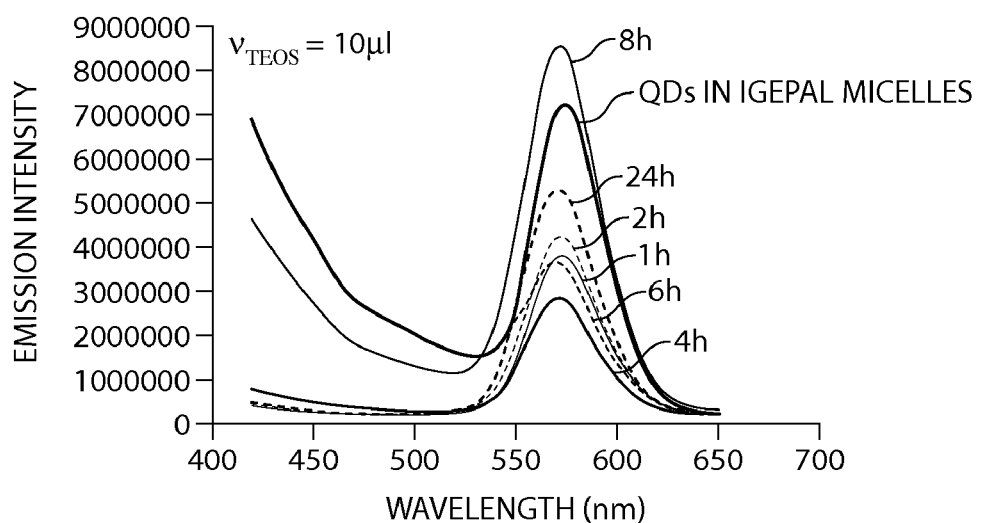
Figure 15C:
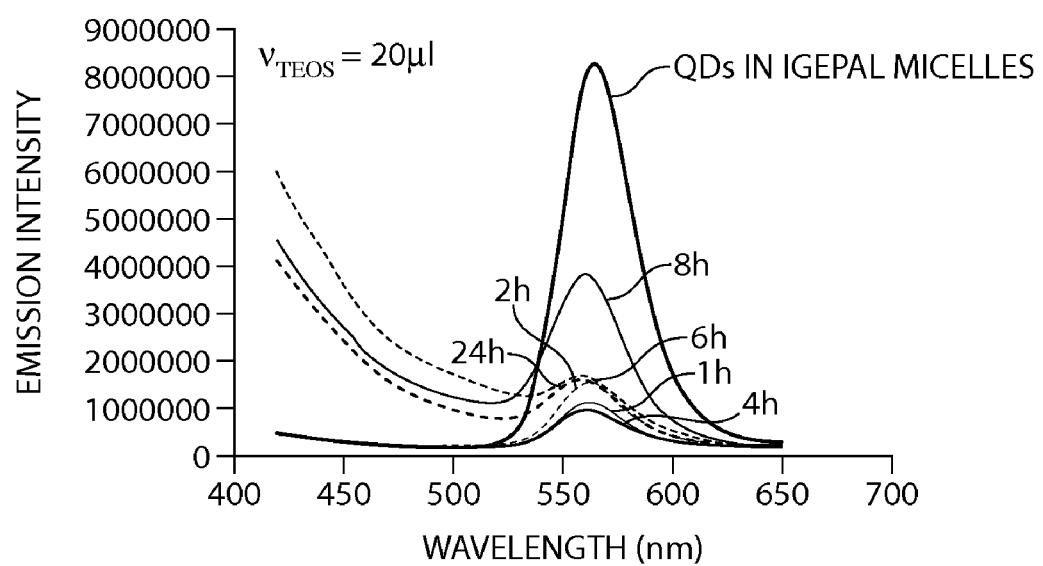

Preparation of Silica-Coated Nanocrystals (CdSe/$SiO_2$) in IGEPAL Reverse Microemulsion with an Amino Silane, APS, Added CdSe semiconductor nanocrystals passivated with TOPO were precipitated with methanol once and the precipitate was dried under nitrogen in order to be free from methanol. 2 µL of APS were added to the precipitate, which was dissolved in 1 ml of cyclohexane and vortexed until the solution became clear. APS-modified nanocrystals were introduced into the reverse micelles and stirred for 30 minutes. 100 µl of 29.5% $NH_4OH$ was the added and stirred for another 1 hour. Finally, 5-20 µl TEOS was added and the stirring continued for 24 hours. Aliquots of samples were taken at different periods of coating times ranging from 1 to 24 hours and emission spectra were recorded for samples from each aliquot (FIGS. 15a-15c).

Figure 16A:
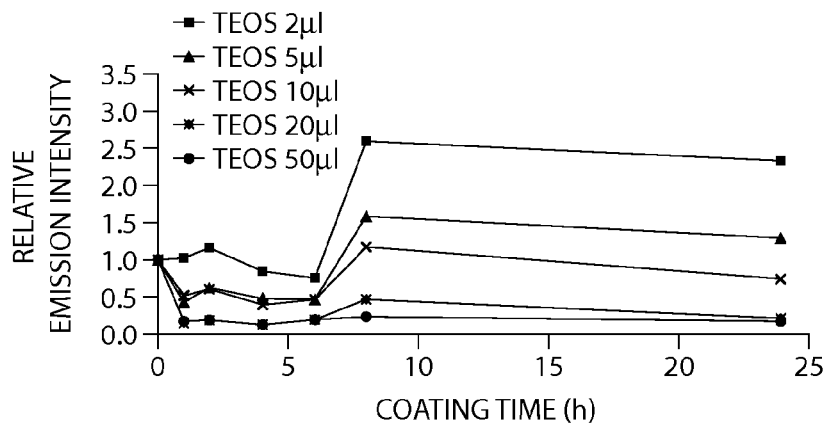
FIG. 16a shows the relative emission intensity versus coating time at various TEOS concentrations for APS-modified core semiconductor nanocrystals.

The results show that APS modification provides more surface passivation than is found in the naked dots. The APS modification is preferably done before injecting the nanocrystals into IGEPAL reverse micelles. With silica coating, there is no initial decrease in the emission intensity at lower TEOS concentrations (FIGS. 15a and 15b), but there is a decrease at higher concentrations (FIG. 15c). At 8 hours of coating time, the emission intensity remains higher than all other coating times up to 24 h. The comparison of the emission intensities at 8 and 24 hours shows a negligible decrease (FIG. 16a) irrespective of TEOS concentration. This is believed to occur because the amine groups provide additional surface passivation for the APS-modified nanocrystals in comparison to the similar nanocrystals absent the APS modification. Furthermore, the acidity of the silanol groups that are formed during extended periods of silica coating does not seem to affect the emission properties as the amine protects the nanocrystal surface.

Figure 16B:
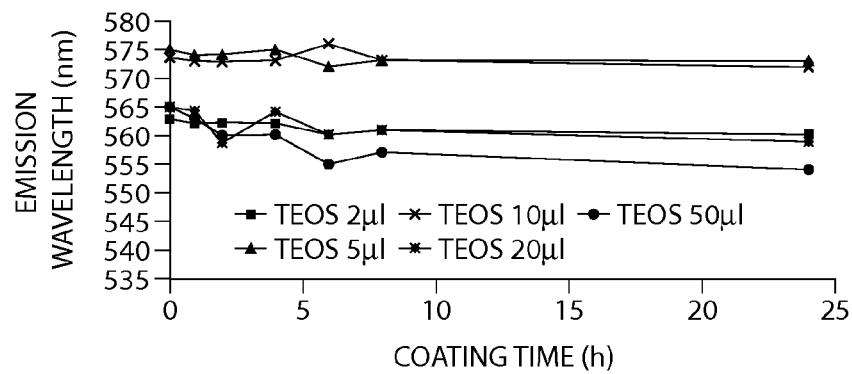
FIG. 16b shows the emission wavelength versus coating time at various TEOS concentrations for APS-modified core semiconductor nanocrystals.
Figure 16C:
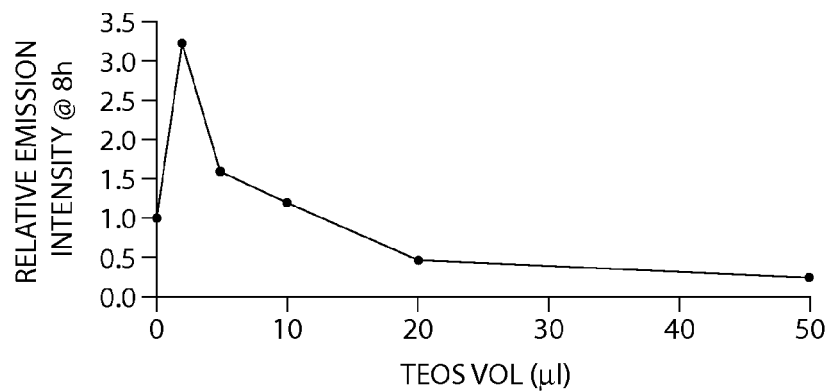
FIG. 16c shows the relative emission intensity versus TEOS concentrations at 8 hours coating time for APS-modified core semiconductor nanocrystals.

FIG. 16b illustrates the effect of coating time on the emission wavelength for different TEOS concentrations and different particles sizes of APS-modified nanocrystals. Although silica-coated nanocrystals exhibit a blue shift (5-10 nm) in comparison with naked (uncoated) nanocrystals at different coating times and various TEOS concentrations, the observed blue shifts are small compared to those for unmodified nanocrystals (10-20 nm) as shown in FIG. 13b. From this data, good conditions for silica coating are found to be 2 µl TEOS and 8 hours of coating time (FIG. 16c).

Example 7

TEM Characterization of Silica-Coated Nanocrystals (CdSe/$SiO_2$) in Water

Figure 17A:
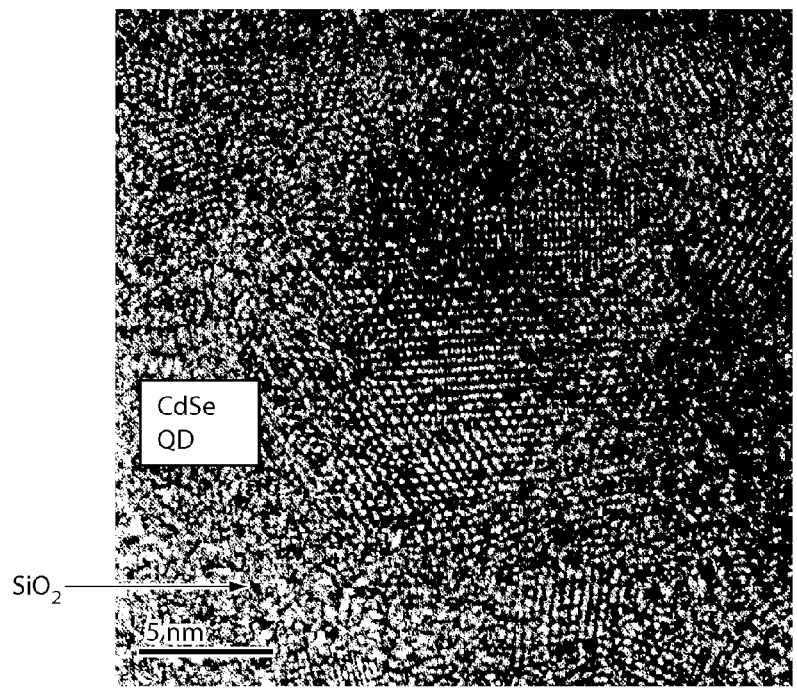
FIG. 17a is a photocopy of a high-resolution TEM micrograph of silica-coated CdSe semiconductor nanocrystals in water.
Figure 17B:
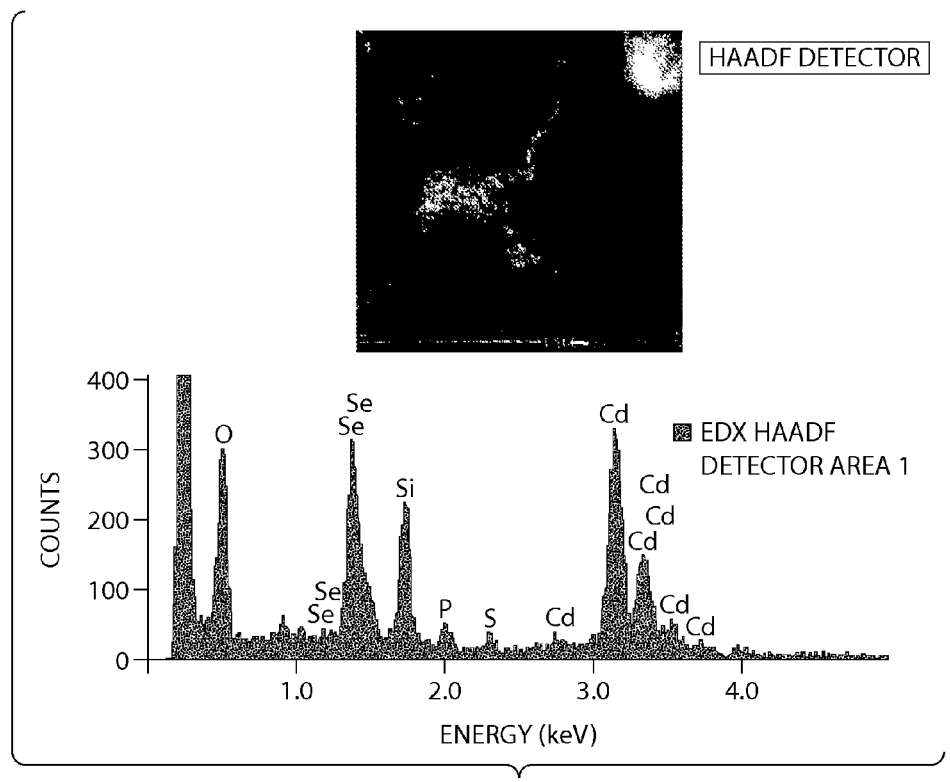
FIG. 17b shows the EDX mapping of silica-coated CdSe semiconductor nanocrystals in water.

The silica-coated colloidal solution was centrifuged at 12000 rpm for 20 minutes and the resulting pellet was washed with deionized water twice and dispersed in a mixture of water and phosphate buffered saline (PBS). FIG. 17a shows the HRTEM image of silica-coated nanocrystals in water. The lattice fringes of CdSe are marked by arrows. The energy dispersive analysis of X-rays (EDX) mapping (FIG. 17b) confirms the presence of all elements that are predicted: Cd, Se from CdSe semiconductor nanocrystal core, Si, O from $SiO_2$ shell and P from TOPO. Sulfur impurity, possibly from surfactant, is also seen.

Example 8

Photo-stability of Silica-Coated Nanocrystals (CdSe/$SiO_2$) in Water

Figure 18A:
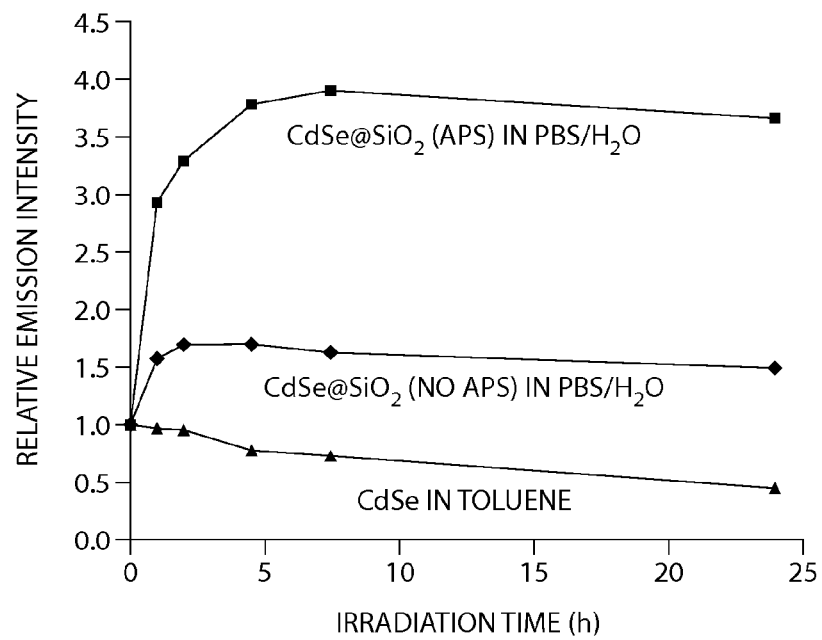
FIG. 18a shows the photo-stability of CdSe semiconductor nanocrystals coated with silica in PBS/$H_2O$ with and without APS. For comparison, core semiconductor nanocrystals in toluene are shown.
Figure 18B:
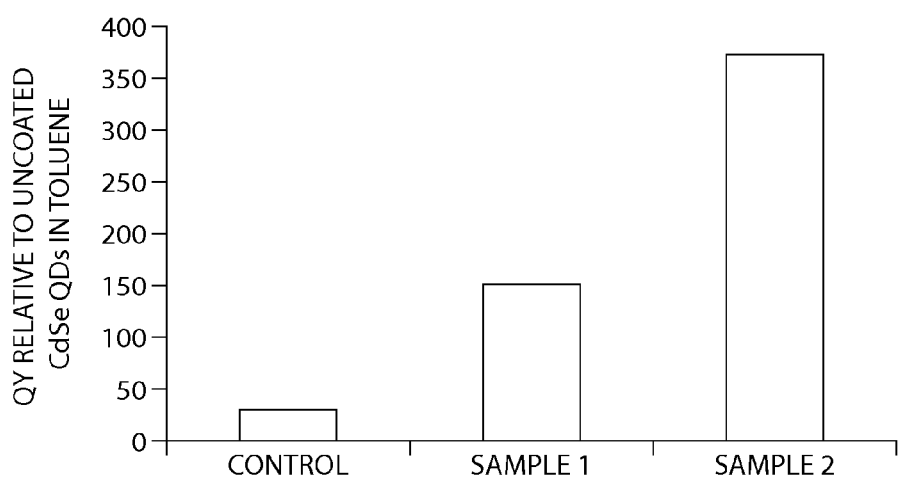
FIG. 18b depicts the increase in percentage of Quantum Yield for silica-coated CdSe Semiconductor nanocrystals relative to the uncoated CdSe semiconductor nanocrystals in toluene after irradiation with 365 nm excitation for 24 hours.

FIG. 18a shows the photo-stability of three different semiconductor nanocrystals. Included are silica-coated nanocrystals without APS and silica-coated nanocrystals with APS, both in a mixture of water and phosphate buffered saline (PBS). The third nanocrystal is an uncoated nanocrystal (no silica) in toluene. As can be seen, the coated dots exhibited superior photo-stability than did the uncoated ones. The increase in QY relative to the uncoated nanocrystals in toluene is believed to be due to the photo-brightening of silica-coated nanocrystals. This may be caused by the photo-ionization of the nanocrystals. An approximately three-fold increase in QY for silica-coated nanocrystals with APS modification before coating, compared to silica-coated nanocrystals without APS modification, is clearly seen in FIG. 18b.

Example 9

Preparation of PEG-Silica-Coated Nanocrystals (CdSe/ZnS/$SiO_2$ and CdSe/$SiO_2$) in IGEPAL Reverse Microemulsion with No APS Added CdSe/ZnS and CdSe nanocrystals passivated with TOPO were precipitated with methanol once and the precipitate was dried under nitrogen in order to be free from methanol. To the precipitate, cyclohexane was added and vortexed until the solution became clear. The nanocrystals were introduced into an aqueous in non-aqueous emulsion, as described above, and stirred for 30 minutes. 50 µl $NH_4OH$ containing polyethylene glycol monomethyl ether (PEG-m) concentration of 0.05 g/ml $NH_4OH$, was added and stirred for another 1 hour. Finally, TEOS was added at different amounts and the stirring continued for 144 hours. Aliquots of samples were taken at different periods of coating times ranging from 24 to 144 hours. The samples were then transferred to water, and the resulting suspensions remained stable, even after 3 weeks. The enhanced solubility is attributed to the repulsion force and solvation layer provided by the PEG. The quantum yield associated with different coating times was also recorded.

Figure 19:
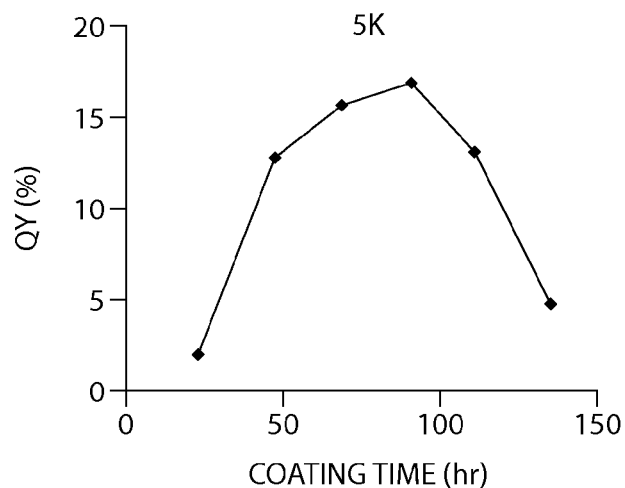
FIG. 19 graphically illustrates silica coating time vs. quantum yield for CdSe/ZnS semiconductor nanocrystals.

FIG. 19 illustrates the effect of silica coating time of CdSe/ZnS nanocrystals on the quantum yield of the samples. The quantum yield is plotted against coating time. The results show that the emission intensity increases to a maximum after 90 hours of silica coating. The maximum quantum yield (17%) achieved is greater than that of the pre-coated CdSe/ZnS (10%). This is attributed to enhanced surface passivation by the silica coating layer surface moiety.

Figure 20:
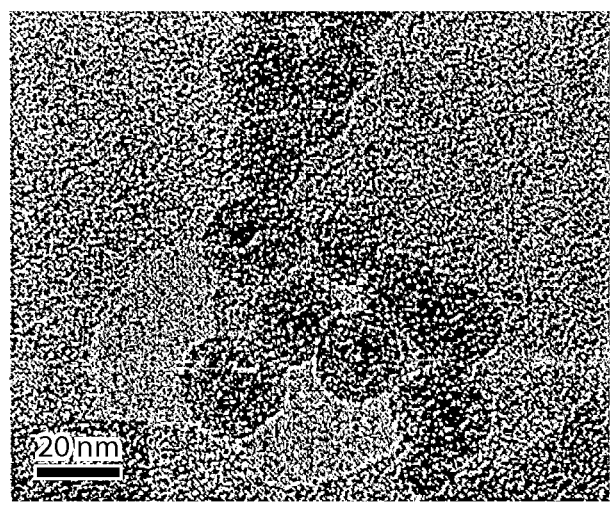
FIG. 20 is a photocopy of a micrograph illustrating single cores of CdSe/ZnS encapsulated within single shells of silica having a diameter of about 25 nm.
Figure 21:
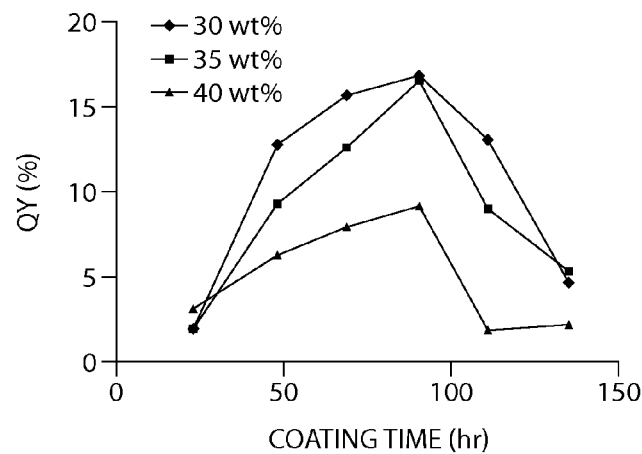
FIG. 21 graphically illustrates coating time vs. quantum yield for different water concentrations in the microemulsion.
Figure 22A:
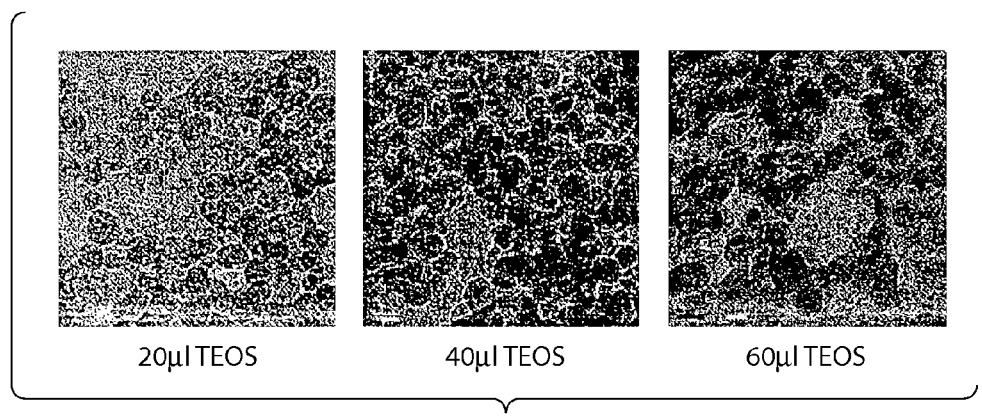
FIG. 22a is a photocopy of a micrograph showing consistent shell thickness, improved sphericity and improved monodispersity at increasing amounts of TEOS.
Figure 22B:
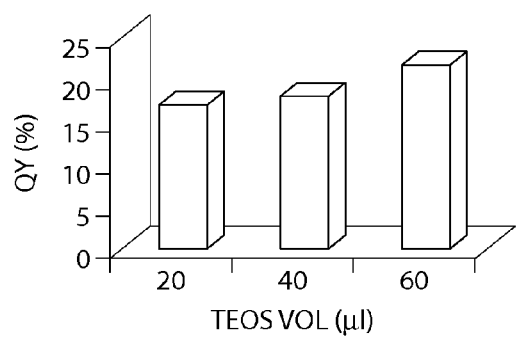
FIG. 22b is a bar graph showing improved quantum yield with greater amounts of TEOS.

FIG. 20 provides an electron micrograph showing that the CdSe/ZnS is encapsulated as single particle within a silca shell of diameter ~25 nm. Varying the amount of water (0.3% to 0.4%) in the microemulsion does not appear to affect the shell thickness but does appear to decrease the quantum yield (FIG. 21). Varying the volume of TEOS added (20-60 µl) does not appear to affect the shell thickness but does seem to improve the sphericity and monodispersity of the particles, as well as the quantum yield, as evidenced by FIGS. 22a and 22b.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified. Thus, as a non-limiting example, a reference to "A and/or B" can refer, in one embodiment, to A only (optionally including elements other than B); in another embodiment, to B only (optionally including elements other than A); in yet another embodiment, to both A and B (optionally including other elements); etc.

As used herein in the specification and in the claims, unless clearly indicated to the contrary, "or" should be understood to have the same meaning as "and/or" as defined above. For example, when separating items in a list, "or" and "and/or" each shall be interpreted as being inclusive, i.e., the inclusion of at least one, but also including more than one, of a number or list of elements, and, optionally, additional unlisted items. In general, the term "or" as used herein shall only be interpreted as indicating exclusive alternatives (i.e. "one or the other but not both") when preceded by terms of exclusivity, such as "only one of" or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements that the phrase "at least one" refers to, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one act, the order of the acts of the method is not necessarily limited to the order in which the acts of the method are recited.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A coated nanoparticle comprising:
   a core comprising a semiconductor material;
   a non-semi-conductor passivation layer, wherein the passivation layer comprises aminopropyl trimethoxysilane; and
   a non-organic shell comprising silica and polyethylene glycol or a derivative thereof encapsulating at least partially the core and the passivation layer.

2. The coated nanoparticle of claim 1, wherein the nanoparticle is water soluble.

3. The nanoparticle of claim 2 wherein the non-organic shell is not chemically bound to the core.

4. The nanoparticle of claim 1 wherein the polyethylene glycol has a molecular weight of about 5,000 to 10,000.

5. The nanoparticle of claim 1, wherein the nanoparticle is soluble in an aqueous solution having a pH of less than about 8.0.

6. The nanoparticle of claim 1, wherein the nanoparticle is soluble in an aqueous solution having a pH of less than or equal to 7.

7. The nanoparticle of claim 1 having a mean diameter of less than 50 nm.

8. The nanoparticle of claim 1 having a mean diameter of less than or equal to 25 nm.

9. The nanoparticle of claim 1 having an emission at 550-600 nm.

10. The nanoparticle of claim 1 having a quantum yield of about 10-20% in an aqueous medium.

11. The nanoparticle of claim 1, wherein the core comprises a cadmium chalcogenide.

12. The nanoparticle of claim 1, wherein the core comprises CdSe.

13. The nanoparticle of claim 1, wherein the core comprises CdSe/ZnS.

* * * * *

UNITED STATES PATENT AND TRADEMARK OFFICE
CERTIFICATE OF CORRECTION

PATENT NO. : 7,405,002 B2
APPLICATION NO. : 10/911402
DATED : July 29, 2008
INVENTOR(S) : Jackie Y. Ying et al.

It is certified that error appears in the above-identified patent and that said Letters Patent is hereby corrected as shown below:

Title Page Item (54), the title "COATED WATER-SOLUBLE NANOPARTICLES COMPRISING SEMICONDUCTOR CORE AND SILICA COATING" should be --COATED WATER SOLUBLE NANOPARTICLES--

Column 1, lines 1-4, the title "COATED WATER-SOLUBLE NANOPARTICLES COMPRISING SEMICONDUCTOR CORE AND SILICA COATING" should be --COATED WATER SOLUBLE NANOPARTICLES--

Signed and Sealed this

Fourteenth Day of October, 2008

JON W. DUDAS
*Director of the United States Patent and Trademark Office*